United States Patent

Hatada et al.

Patent Number: 6,021,322
Date of Patent: Feb. 1, 2000

[54] AM RADIO RECEIVER

[75] Inventors: Shigeru Hatada; Yukio Suzuki, both of Tsurugashima, Japan

[73] Assignee: Toko, Inc., Japan

[21] Appl. No.: 08/976,432

[22] Filed: Nov. 21, 1997

[30] Foreign Application Priority Data

Dec. 10, 1996 [JP] Japan ................................ 8-346726

[51] Int. Cl.$^7$ .................................................. H03B 5/08
[52] U.S. Cl. .................................. 455/193.1; 455/193.3; 455/313
[58] Field of Search ............................ 455/193.1, 193.3, 455/195.1, 313, 245.2, 246.1; 331/15, 117 R, 47

[56] References Cited

U.S. PATENT DOCUMENTS

| | | | |
|---|---|---|---|
| 3,714,584 | 1/1973 | Allner | 455/157.1 |
| 3,755,763 | 8/1973 | Hoshi | 334/1 |
| 4,030,035 | 6/1977 | Ienaka et al. | 455/237.1 |
| 4,370,629 | 1/1983 | Martin | 331/179 |
| 4,628,540 | 12/1986 | Hendriks | 455/195.1 |
| 4,837,852 | 6/1989 | Takada et al. | 455/193.3 |
| 4,847,572 | 7/1989 | Yokoyama | 331/177 V |
| 5,481,227 | 1/1996 | Komori et al. | 331/2 |

FOREIGN PATENT DOCUMENTS 3-158016  8/1991  Japan .

OTHER PUBLICATIONS

Ford Radio Service Manual, EPC–49, (1992) Ford Motor Company.

U 4065 B Preliminary Information, TEMIC Telefunken Semiconductors; Aug. 18, 1994, pp. 1–24.

Munehiro Karasudani, et al., A New Car Tuner System IC, SAE Technical Paper Series, SAE International, International Congress and Exposition, Detroit, Michigan Feb. 26 –Mar. 2, 1990.

*Primary Examiner*—Dwayne D. Bost
*Assistant Examiner*—Sonny Trinh
*Attorney, Agent, or Firm*—Londa and Traub LLP

[57] ABSTRACT

In an AM radio receiver, a radio-frequency tuning circuit comprises a tuning coil, and variable capacitance diode elements connected to the tuning coil; a local oscillator circuit comprises an oscillator coil, a variable capacitance diode element connected in parallel with the oscillator coil, and a capacitance element connected in series with the oscillator coil; and tuning voltage is applied from a variable voltage source to the variable capacitance diode elements of the high-frequency tuning circuit, and to the variable capacitance diode element of the local oscillator circuit through a voltage adjustment circuit connected to the variable voltage source and a reference voltage source.

4 Claims, 5 Drawing Sheets

AM RADIO RECEIVER

BACKGROUND OF THE INVENTION

1. Field of the Invention

The present invention relates to an AM radio receiver adapted for receiving amplitude-modulated signals, and more particularly it pertains to an AM radio receiver of the so-called up-conversion type, which comprises a radio-frequency tuning circuit for selecting amplitude-modulated signal received at antenna; a local oscillator circuit for generating an oscillating signal which is used in a first frequency conversion section to convert the receiving signal to an intermediate frequency signal having a higher frequency than that of the receiving signal.

2. Description of the Prior Art

Referring to FIG. 7 of the accompanying drawings, there is shown a circuit diagram of prior-art AM radio receiver, which includes a radio-frequency tuning circuit 71 arranged to select an amplitude-modulated signal received at an antenna, and a local oscillator circuit 72 arranged to generate an oscillating signal for converting the receiving signal to an intermediate frequency signal having a higher frequency than that of the receiving signal.

The radio-frequency tuning circuit 71 comprises a tuning coil L9, and variable capacitance diodes D14 and D15 having their cathodes connected together. The pair of variable capacitance diodes D14 and D15 are connected in parallel with the tuning coil L9.

The local oscillator circuit 72 comprises an oscillator coil L10, a capacitor C9, and a variable capacitance diode D16. The capacitor C9 is connected in parallel with the oscillator coil L10, and the variable capacitance diode D26 is connected in series therewith.

The radio-frequency tuning circuit 71 is connected to a D/A converter circuit 73 at the cathodes of the variable capacitance diodes D14 and D15 through a resistor R19. The D/A circuit 73 is connected to a microcomputer 74. Further, the local oscillator circuit 72 is connected to a microcomputer 74 at the cathode of the variable capacitance diode D16 through a resistor R20. The microcomputer 74 is coupled to an EPROM 75.

The radio-frequency tuning circuit 71 has the circuit constants thereof set up such that amplitude-modulated signals in the range from 522 KHz to 1710 KHz can be tuned in. The local oscillator circuit 72 has the circuit constants thereof set up such that oscillating frequency can be varied in the range from 11222 KHz to 12410 KHz, for the purpose of setting the first intermediate frequency signal to 10.7 MHz at the output of first frequency conversion section. To this end, the variable capacitance diodes of the radio-frequency tuning circuit 71, and the variable capacitance diode of the local oscillator circuit 72 are differentiated from each other in terms of capacitance value and variable capacitance ratio as well as characteristic curve for voltage-to-capacitance value.

With the above-described conventional AM radio receiver, because of the radio-frequency tuning circuit and local oscillator circuit using variable capacitance diodes having different characteristics, the frequency difference between the oscillating frequency of the local oscillator circuit 72 and the tuning frequency of the radio-frequency tuning circuit 71 tends to be deviated far from the desired first intermediate frequency (10.7 MHz), thus resulting in an increased tracking error, when common tuning voltage is applied to the variable capacitance diodes of the radio-frequency tuning circuit 71 and the variable capacitance diode of the local oscillator circuit 72.

Disadvantageously, therefore, the conventional AM radio receiver of the above-mentioned type using variable capacitance diodes having different characteristics for the radio-frequency tuning circuit and local oscillator circuit, requires corrective means for establishing a proper variable capacitance ratio required in the respective circuits and for making approximate the slopes of the different characteristic curves of the variable capacitance diodes employed with the respective circuits, with a view to restraining occurrence of tracking error.

In the conventional AM radio receiver illustrated in FIG. 7, such corrective means is constituted by the D/A converter circuit 73, microcomputer 74 and EPROM 75. More specifically, the arrangement is made such that a first tuning voltage provided by the microcomputer 74 is applied to the local oscillator circuit 72 and a second tuning voltage which is provided by the microcomputer 74 on the basis of pre-stored data in the EPROM 75 is applied to the radio-frequency tuning circuit 71 via the D/A converter circuit 73 so that variable voltage source for the local oscillator circuit 72 and that for the radio-frequency tuning circuit 71 are separately provided, applying different voltages to radio-frequency tuning circuit 71 and local oscillator circuit 72 respectively, thereby reducing tracking error. As will be seen, the above-mentioned conventional AM radio receiver is disadvantageous in that it requires such components as the D/A converter circuit, microcomputer and EPROM and thus the cost of manufacture thereof is increased accordingly.

SUMMARY OF THE INVENTION

It is an object of the present invention to provide a novel and improved AM radio receiver which is designed such that tracking error can be minimized without employing any such components as the aforementioned microcomputer, EPROM and D/A converter circuit.

The AM radio receiver according to a first embodiment of the present invention comprises a radio-frequency tuning circuit for selecting amplitude-modulated signal received at antenna; a local oscillator circuit for generating an oscillating signal which is used in a first frequency conversion section to convert the receiving signal to an intermediate frequency signal having a higher frequency than that of the receiving signal, wherein the radio-frequency tuning circuit comprises a tuning coil, and a variable capacitance diode element connected to the tuning coil; the local oscillator circuit comprises an oscillator coil, a variable capacitance diode element connected in parallel with the oscillator coil, and a capacitance element connected in series therewith; and tuning voltage derived from a variable voltage source is applied to the variable capacitance diode elements of the radio-frequency tuning circuit, and to the variable capacitance diode element of the local oscillator circuit the tuning voltage is applied through the voltage adjustment circuit which is connected between the variable voltage source and a reference voltage source.

Further, the AM radio receiver according to a second embodiment of the present invention comprises a radio-frequency tuning circuit for selecting amplitude-modulated signal received at antenna; a local oscillator circuit for generating an oscillating signal which is used in a first frequency conversion section to convert the receiving signal to an intermediate frequency signal having a higher frequency than that of the receiving signal, wherein the radio-frequency tuning circuit comprises a tuning coil, and variable capacitance diode elements connected to the tuning coil; the local oscillator circuit comprises an oscillator coil, a variable capacitance diode element connected in parallel with the oscillator coil, and a capacitance element connected in series therewith; the variable capacitance diode element of the radio-frequency tuning circuit is connected to a variable voltage source; and the variable capacitance diode elements of the local oscillator circuit are coupled to the variable voltage source through a voltage adjustment circuit connected to a reference voltage source.

As will be seen from the foregoing description, the AM radio receiver according to the present invention is arranged such that tuning voltage is derived from the variable voltage source, and such that tuning voltage different from that applied to the variable capacitance diode elements of the radio-frequency tuning circuit is applied to the variable capacitance diode elements of the local oscillator circuit with the aid of the voltage adjustment circuit which is connected between the variable voltage source and the variable capacitance diode elements of the local oscillator circuit.

Further, the AM radio receiver according to the present is designed such that the characteristic curves of the variable capacitance diodes of the local oscillator circuit are adjusted by means of the capacitance element connected in series with the oscillator coil of the local oscillator circuit.

Other objects, features and advantages of the present invention will become apparent from the ensuing description taken in connection with the accompanying drawings.

DESCRIPTION OF THE PREFERRED EMBODIMENTS

Description will now be made of the AM radio receiver embodying the present invention with reference to FIGS. 1 to 6.

Figure 1:
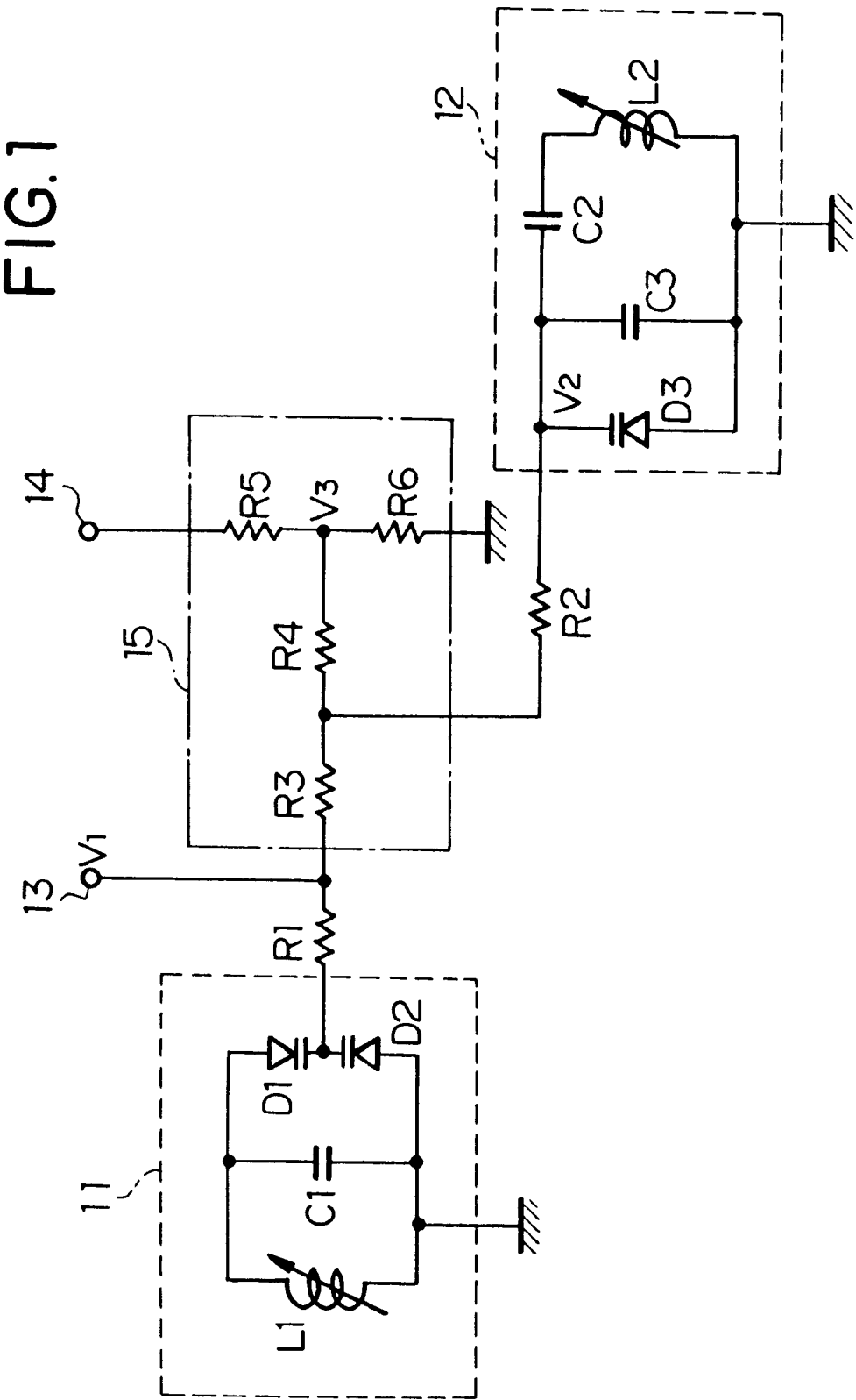
FIG. 1 is a circuit diagram illustrating the AM radio receiver according to a first embodiment of the present invention.

FIG. 1 illustrates the AM radio receiver according to a first embodiment of the present invention, which includes a radio-frequency tuning circuit 11, local oscillator circuit 12, variable voltage supply terminal 13 connected to a variable voltage source, reference voltage supply terminal 14 coupled to a reference voltage source, and voltage adjustment circuit 15.

The radio-frequency tuning circuit 11 comprises a tuning coil L1, variable capacitance diodes D1 and D2, and capacitor C1. The variable capacitance diodes D1 and D2 have their cathodes connected together, with the anode of the variable capacitance diode D1 being tied to one end of the tuning coil L1, and with the anode of the variable capacitance diode D2 being coupled to the other end of the tuning coil L1. The capacitor C1 is connected in parallel with the tuning coil L1. The local oscillator circuit 12 comprises an oscillator coil L2, a variable capacitance diode D3, and capacitors C2 and C3 which serve to characterize tracking performance in the form of a cubic function, thereby reducing tracking error. The capacitor C2 has one end thereof connected to one end of the oscillator coil L2 so as to be in series with the oscillator coil L2. Coupled to the other end of the capacitor C2 are one end of the variable capacitance diode D3 and one end of the capacitor C3. The other ends of the variable capacitance diode D3 and capacitor C3 are connected to the other end of the oscillator coil L2.

Further, in the radio-frequency tuning circuit 11, the cathodes of the variable capacitance diodes D1 and D2 are connected to the variable voltage supply terminal 13 through a resistor R1. In the local oscillator circuit 12, a resistor R2 is connected to the cathode of the variable capacitance diode D3, and to the variable voltage supply terminal 13 through the voltage adjustment circuit 15 which is coupled to the reference voltage supply terminal 14.

In the voltage adjustment circuit 15, resistors R5 and R6 are connected in series between the reference voltage supply terminal 14 and the ground, and resistors R3 and R4 are connected in series between the connecting point of the resistors R5 and R6 and the variable voltage supply terminal 13. Connected to the connecting point of the resistors R3 and R4 through the resistor R2 is the local oscillator circuit 12.

Tuning voltage from the variable voltage supply terminal 13 is applied to the variable capacitance diodes D1 and D2 of the radio-frequency tuning circuit, and to the variable capacitance diode D3 of the local oscillator circuit 12. Reference voltage is applied from the reference voltage supply terminal to the voltage adjustment circuit 15.

The respective circuit constants of the radio-frequency tuning circuit 11 and local oscillator circuit 12 are set up such that the difference between the oscillating frequency of the local oscillator circuit 12 and the tuning frequency of the radio-frequency tuning circuit gets close to 10.7 MHz. The radio-frequency tuning circuit 11 uses the variable capacitance diodes D1 and D2 each having a variable capacitance ratio equal to or higher than 10.73 so as to be tunable to any amplitude-modulated signal in the frequency range of 522 KHz to 1710 KHz. Further, the local oscillator circuit 13 employs the variable capacitance diode D3 having a variable capacitance ratio equal to or higher than 1.22 so as to be able to produce oscillation in the range of 11222 KHz to 12410 KHz.

With the AM radio receiver constructed as mentioned above in accordance with the present invention, voltage applied to the variable capacitance diode of the local oscillator circuit 12 is adjusted in accordance with the ratio of the resistance values for the resistors R3 and R4 and the ratio of the resistance values for the resistors R5 and R6 in the voltage adjustment circuit 15.

Figure 2:
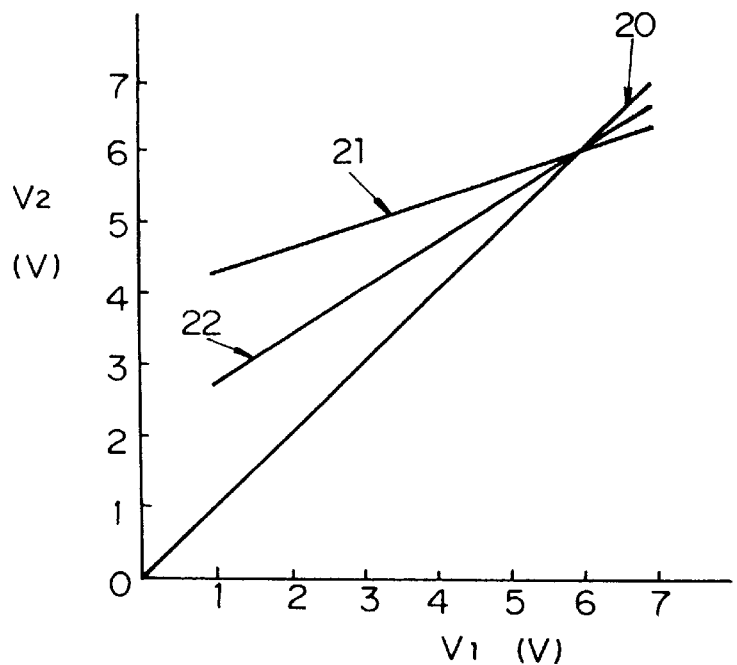
FIG. 2 is a graph showing the relationship between a tuning voltage applied at a variable voltage supply terminal and a tuning voltage applied to a variable-capacitance diode of a local oscillator when the ratio of the resistance values for resistors R3 and R4 of a voltage adjustment circuit is changed.

In the voltage adjustment circuit 15, within the tuning voltage provided from the variable voltage supply terminal 12, the tuning voltage applied to the variable capacitance diode of the local oscillator circuit 13 is adjusted in accordance with the ratio of the resistance value for the resistor R3 and the resistance value for the resistor R4, as shown in FIG. 2.

FIG. 2 is a graph showing the relationship between the tuning voltage V1 derived from the variable voltage supply terminal 13 and the tuning voltage V2 applied to the variable capacitance diode D3 of the local oscillator circuit 12, when the ratio of the resistance value for the resistor R3 and the resistance value for the resistor R4 in the voltage adjustment circuit 15 is changed. FIG. 2 illustrates the case where the reference voltage V3 applied to the connecting point of the resistors R5 and R6 is 6 V.

In FIG. 2, the vertical axis indicates the tuning voltage V2 applied to the variable capacitance diode D3 of the local oscillator circuit 12, and the horizontal axis represents the tuning voltage V1 derived from the variable voltage supply terminal 13., wherein 21 and 22 represent the relationships between the tuning voltages V1 and V2 when the ratio of the resistance values for the resistors R3 and R4 is set at 33:18 and 18:33, respectively; and 20 indicates the relationship between the tuning voltages V1 and V2 when tuning voltage is applied to the variable capacitance diode D3 of the local oscillator circuit 12 without using the voltage adjustment circuit 15.

Within the tuning voltage applied from the variable voltage supply terminal 13, by adjusting the tuning voltage ratio applied to the variable capacitance diode D3 of the local oscillator circuit 12, the variable capacitance ratio of the local oscillator circuit 12 is set up such that the local oscillation is enabled to produce oscillating frequency in the range of 11222 KHz to 12410 KHz.

In the voltage adjustment circuit 15, the reference voltage V3 applied to the connecting point of the resistors R5 and R6 is adjusted in accordance with the ratio of the resistance values for the resistors R5 and R6.

Figure 3:
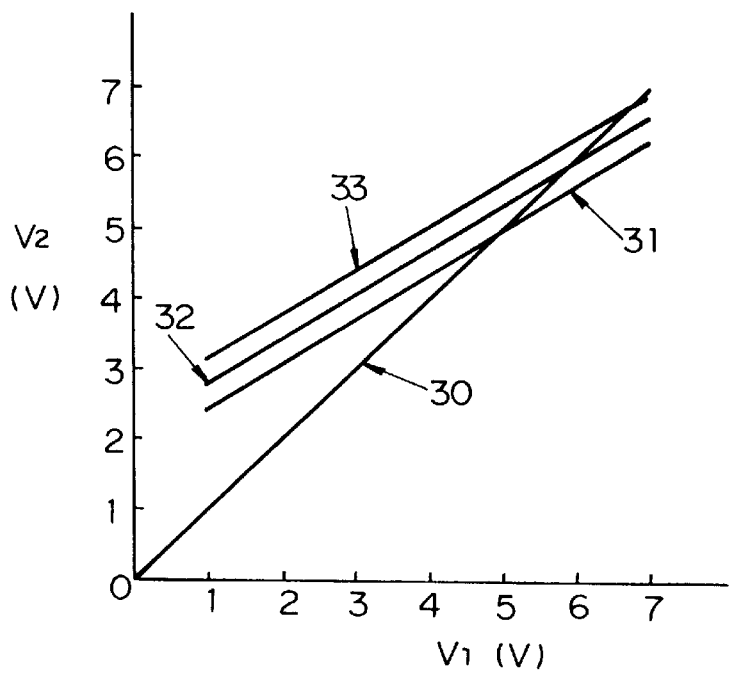
FIG. 3 is a graph showing the relationship between the tuning voltage applied at the variable voltage supply terminal and the tuning voltage applied to the variable-capacitance diode of the local oscillator when a reference voltage applied to the voltage adjustment circuit is changed.

FIG. 3 is a graph showing the relationship between the tuning voltage $V_1$ derived from the variable voltage supply terminal 13 and the tuning voltage $V_2$ applied to the variable capacitance diode D3 of the local oscillator circuit 12, when the reference voltage $V_3$ applied to the connecting point of the resistors R5 and R6 in the voltage control circuit 15 is changed. FIG. 3 illustrates the case where the ratio of the resistance values for the resistors R3 and R4 is set at 18:33.

In FIG. 3, the vertical axis indicates the tuning voltage $V_2$ which is applied to the variable capacitance diode D3 of the local oscillator circuit 12, and the horizontal axis shows the tuning voltage $V_1$ which is derived from the variable voltage supply terminal 13, wherein 31, 32 and 33 represent the relationships between the tuning voltages $V_1$ and $V_2$ when the reference voltage $V_3$ is set at 5 V, 6 V and 7 V, respectively; and 30 shows the relationship between the tuning voltages V1 and V2 when the tuning voltage is applied to the variable capacitance diode D3 of the local oscillator circuit 12 without using voltage adjustment circuit 15.

When the reference voltage $V_3$ is higher than the tuning voltage $V_1$ derived from the variable voltage supply terminal 13, the tuning voltage $V_2$ which is applied to the variable capacitance diode D3 of the local oscillator circuit 12 is given by the following expression:

$$V_2 = V_1 + (V_3 - V_1) \times R_3 \div (R_3 + R_4)$$

where $R_3$ and $R_4$ represent the resistance values for the resistors R3 and R4, respectively.

When the reference voltage $V_3$ is equal to the tuning voltage $V_1$ derived from the variable voltage supply terminal 13, the tuning voltage $V_2$ which is applied to the variable capacitance diode D3 of the local oscillator circuit 12 is given by the following equation:

$$V_2 = V_1$$

When the reference voltage $V_3$ is lower than the tuning voltage $V_1$ derived from the variable voltage supply terminal 13, the tuning voltage $V_2$ which is applied to the variable capacitance diode D3 of the local oscillator circuit 12 is given by the following expression:

$$V_2 = V_1 - (V_1 - V_3) \times R_3 \div (R_3 + R_4)$$

The capacitance value of the local oscillator circuit 12 is set up such that tracking error is minimized through adjustment of the reference voltage $V_3$.

Figure 4:
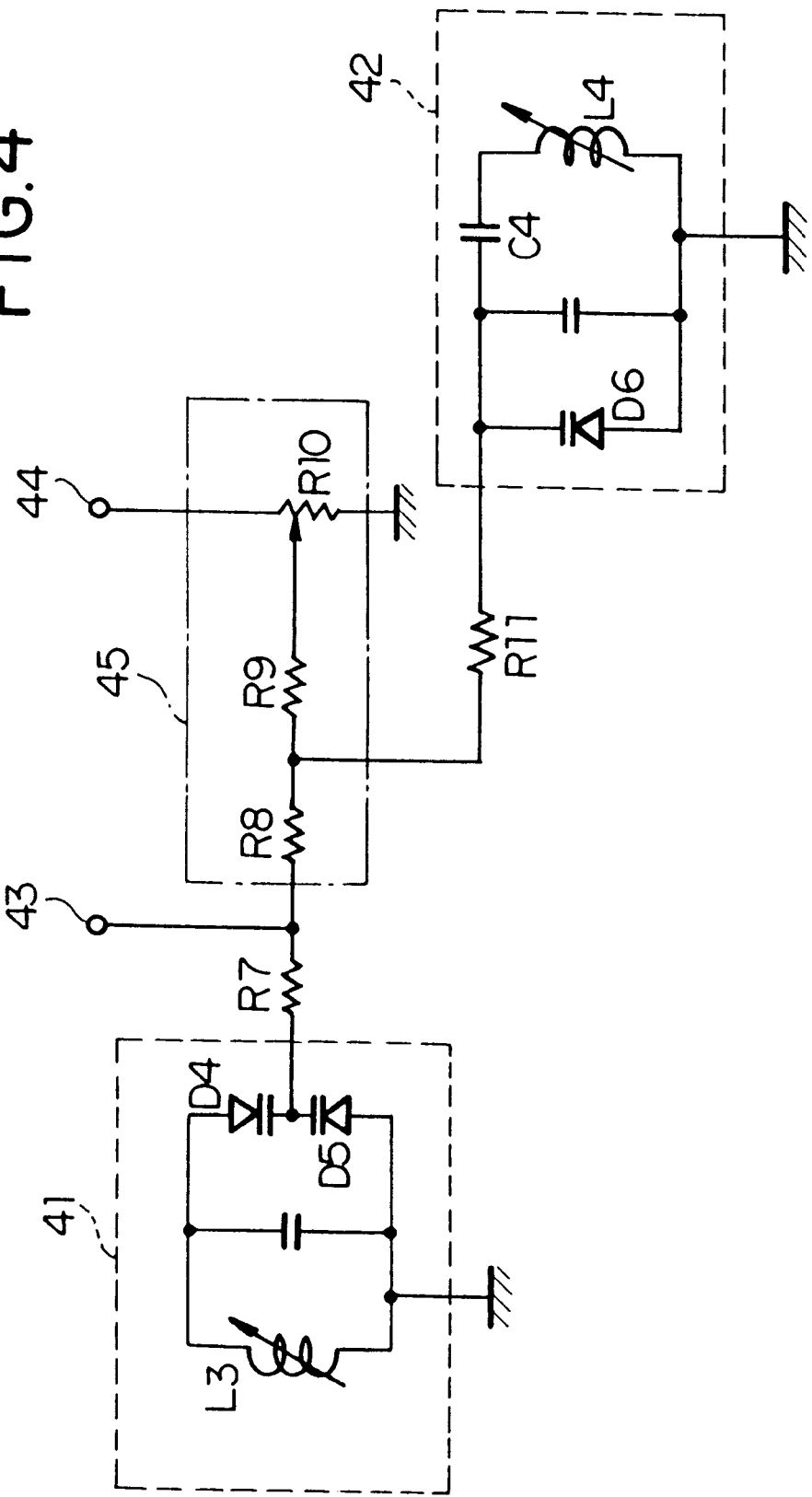
FIG. 4 is a circuit diagram illustrating the AM radio receiver according to a second embodiment of the present invention.

FIG. 4 illustrates the circuit diagram of the AM radio receiver according to a second embodiment of the present invention, which includes a radio-frequency tuning circuit 41, and local oscillator circuit 42.

In the radio-frequency tuning circuit 41, variable capacitance diodes D4 and D5 having their cathodes coupled together are connected in parallel with a tuning coil L3. In the local oscillator circuit 42, a capacitor C4 is connected in series with an oscillator coil L4, and a variable capacitance diode D6 is connected in parallel with the oscillator coil L4.

The radio-frequency tuning circuit 41 is connected to a variable voltage supply terminal 43 through a resistor R7. The local oscillator circuit 42 is coupled to the variable voltage supply terminal 43 through a voltage adjustment circuit 45.

In the voltage adjustment circuit 45, a variable resistor R10 is connected between a reference voltage supply terminal 44 and ground, and resistors R8 and R9 are connected in series between the variable resistor R10 and the variable voltage supply terminal 43. Connected to the connecting point of the resistors R8 and R9 through a resistor R11 is the local oscillator circuit 42.

In the AM radio receiver just described above, reference voltage V3 is adjusted by adjusting the variable resistor R10; thus, even if any dispersion occurs with respect to the capacitance values of the variable capacitance diodes, tracking error that tends to be caused by such dispersion can be minimized by adjusting the resistance value of the variable resistor R10.

Figure 5:
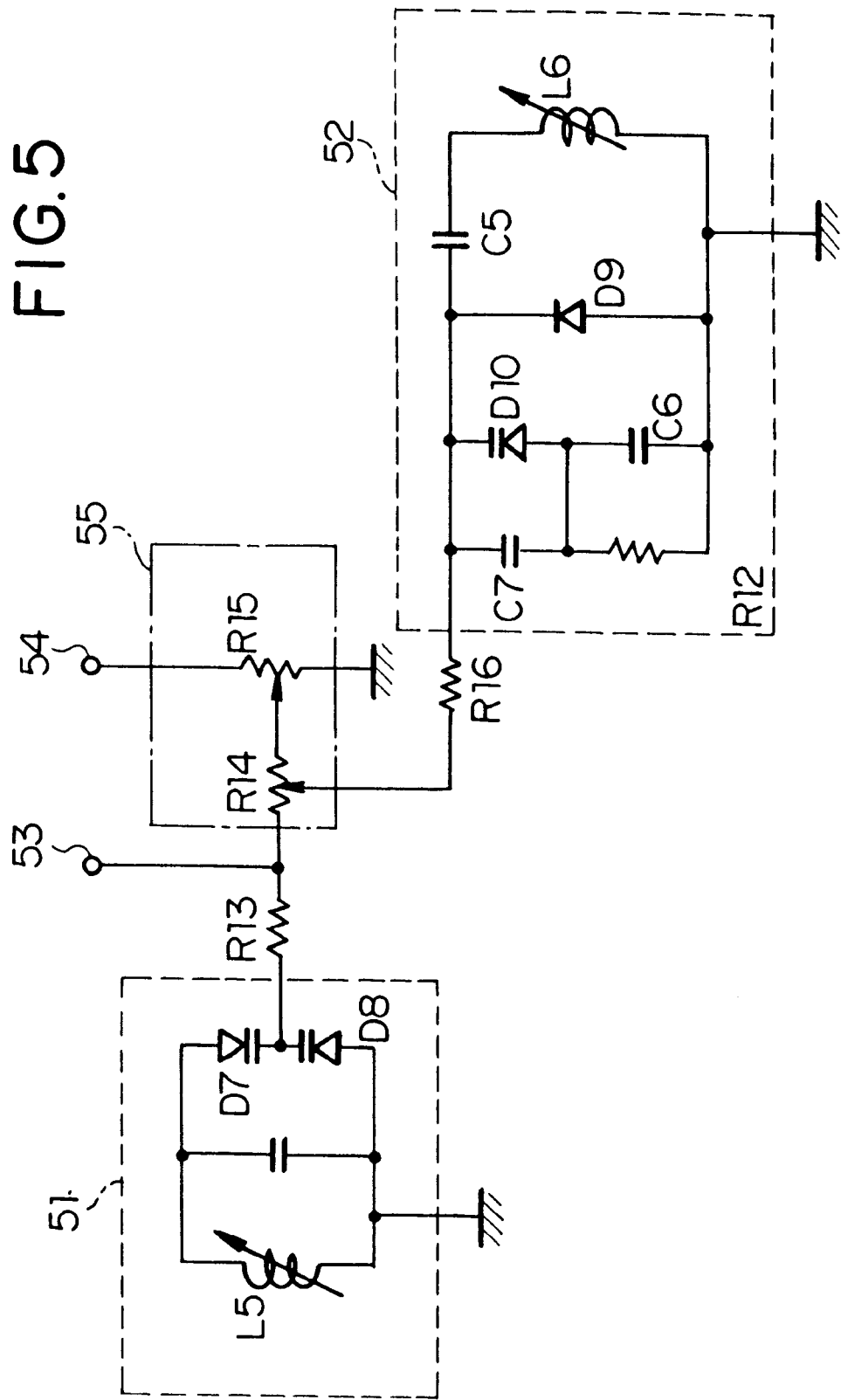
FIG. 5 is a circuit diagram illustrating the AM radio receiver according to a third embodiment of the present invention.

FIG. 5 is a circuit diagram illustrating the AM radio receiver according to a third embodiment of the present invention, which comprises a radio-frequency tuning circuit 51, local oscillator circuit 52, variable voltage supply terminal 53, reference voltage supply terminal 54, and voltage adjustment circuit 55.

The radio-frequency tuning circuit 51 comprises a tuning coil L5, and a pair of variable capacitance diodes D7 and D8 which, having their cathodes coupled together, are connected in parallel with the tuning coil L5.

The local oscillator circuit 52 comprises an oscillator coil L6, variable capacitance diodes D9 and D10, and a capacitor C5 which is connected in series with the oscillator coil L6. The variable capacitance diodes D9 and D10 are connected in parallel with the oscillator coil L6. C5, C6 and C7 are capacitors which serve to characterize tracking performance in the form of a quintic function, thereby minimizing tracking error. R12 is a resistor which feeds DC current.

The voltage adjustment circuit 55 comprises a variable resistor R15 connected between the reference voltage supply terminal 54 and the ground, and another variable resistor R14 connected between the variable resistor R15 and the variable voltage supply terminal 53.

Further, the radio-frequency tuning circuit 51 is connected to the variable voltage supply terminal 53 through a resistor R13, and the local oscillator circuit 52 is coupled to the variable resistor R14 of the voltage adjustment circuit 55 through a resistor R16.

In the AM radio receiver constructed as described just above, with the tuning voltage range given at the variable voltage supply terminal 53, the tuning voltage applied to the variable capacitance diodes D9 and D10 of the local oscillator circuit 52, is adjusted in accordance with the resistance value of the variable resistor R14, and the reference voltage V3 is adjusted in accordance with the resistance value of the variable resistor R15. Thus, even if any dispersion occurs with respect to the variable capacitance ratio and capacitance value of the variable capacitance diodes, tracking error which tends to be caused by such dispersion can be minimized by adjusting the resistance values of the variable resistors R14 and R15.

Figure 6:
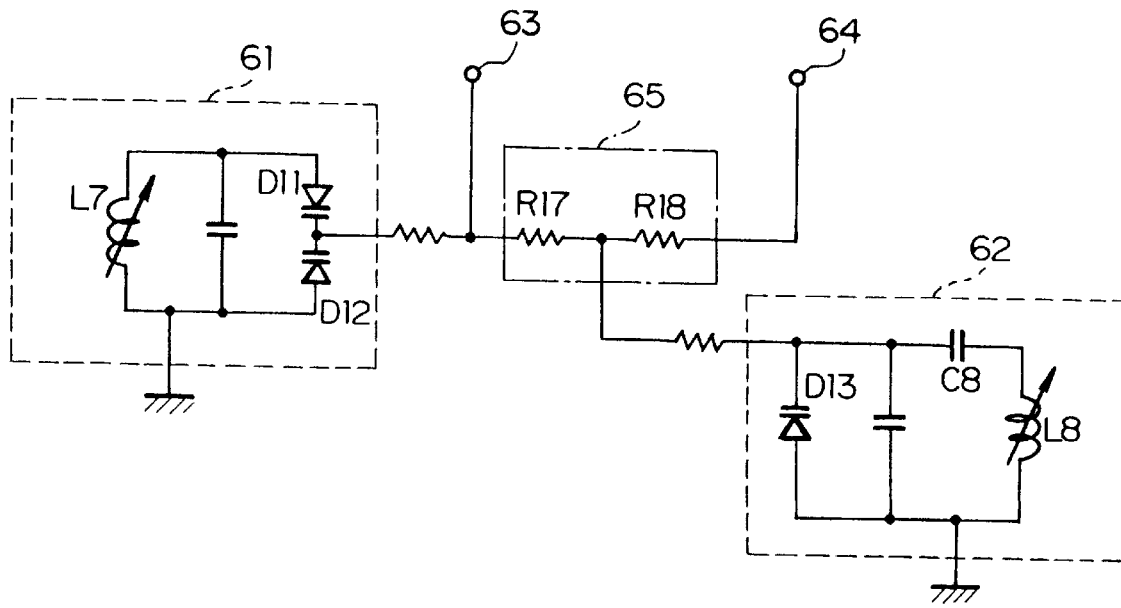
FIG. 6 is a circuit diagram illustrating the AM radio receiver according to a fourth embodiment of the present invention.
Figure 7:
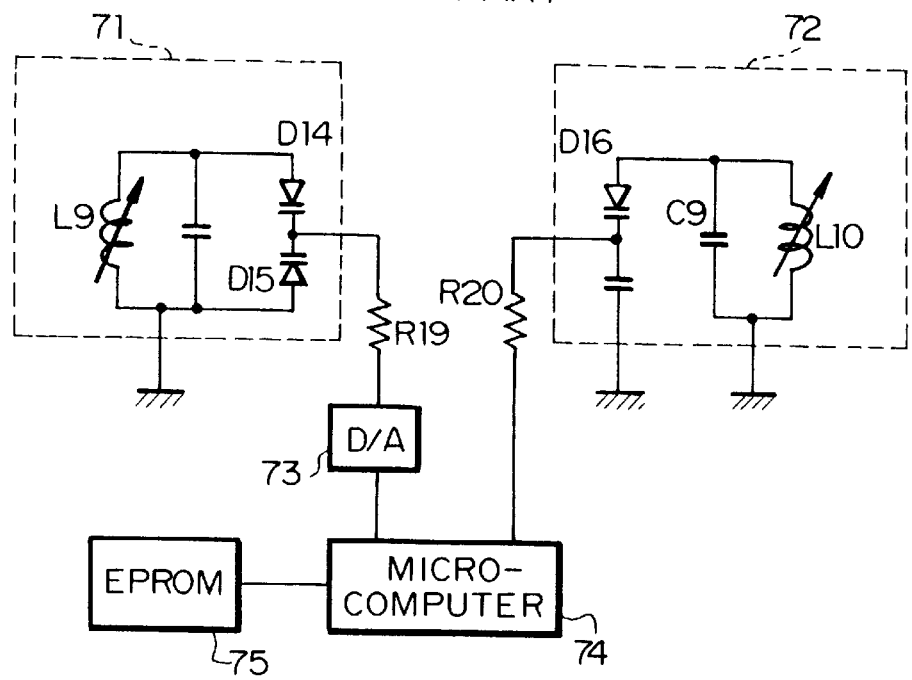
FIG. 7 is a circuit diagram showing prior-art AM radio receiver.

FIG. 6 is a circuit diagram illustrating the AM radio receiver according to a fourth embodiment of the present invention, which comprises a radio-frequency tuning circuit 61, local oscillator circuit 62, variable voltage supply terminal 63, reference voltage supply terminal 64, and voltage adjustment circuit 65.

The radio-frequency tuning circuit 61 comprises a pair of variable capacitance diodes D11 and D12 and a tuning coil L7, and is connected to the variable voltage supply terminal 63. The local oscillator circuit 62 comprises an oscillator coil L8, a capacitor C8 connected in series with the oscillator coil L8, and a variable capacitance diode D13 connected in parallel with the oscillator coil L8. The voltage adjustment circuit 65 comprises resistors R17 and R18 connected in series between the variable voltage supply terminal 63 and the reference voltage supply terminal 64. Connected to the connecting point of the resistors R17 and R18 is the local oscillator circuit 62.

In the AM radio receiver constructed as mentioned just above, with the tuning voltage range given at the terminal 63, the tuning voltage applied to the variable capacitance diode D13 of the local oscillator circuit 62 is set up in accordance with the resistance values for the resistors R17 and R18, and then the reference voltage V3 applied from the terminal 64 is determined.

The AM radio receiver embodying the present invention employs capacitance element connected in series with the oscillator coil and is arranged such that the tuning voltage derived from variable voltage source is applied to variable capacitance diodes of radio-frequency tuning circuit, and the tuning voltage is also applied to variable capacitance diode or diodes of local oscillator circuit through voltage adjustment circuit connected to the variable voltage source and reference voltage source as described above, and with such arrangement, it will be appreciated that tracking error can be minimized without using components such as microcomputer, EPROM, and D/A converter circuit. A further advantage is such that by virtue of the fact that the tuning voltage applied to the local oscillator circuit can be adjusted by means of the voltage adjustment circuit, the AM radio receiver according to the present invention can be constructed by using a single variable voltage source even if different types of variable capacitance diodes which are not identical in terms of characteristics (variable ratio and capacitance value) are used for the radio-frequency tuning circuit and local oscillator circuit.

While the present invention has been illustrated and described with respect to some specific embodiments thereof, it is to be understood that the present invention is by no means limited thereto but encompasses all changes and modifications which will become possible within the scope of the appended claims. It is also possible, for example, that the radio-frequency tuning circuit may be comprised of a parallel circuit of a tuning coil and capacitor, and a variable capacitance diode and capacitor which are connected in series between the parallel circuit and the ground.

What is claimed is:

1. An AM radio receiver comprising a radio-frequency tuning circuit for selecting amplitude-modulated signal received at antenna; a local oscillator circuit for generating an oscillating signal which is used in a first frequency conversion section to convert receiving signal to an intermediate frequency signal having a higher frequency than that of the receiving signal, wherein:

said radio-frequency tuning circuit comprises a tuning coil, and variable capacitance diode elements connected to said tuning coil;

said local oscillator circuit comprises an oscillator coil, a variable capacitance diode element connected in parallel with said oscillator coil, and a capacitance element connected in series with said oscillator coil; and the variable capacitance diode elements of said radio-frequency tuning circuit are connected to a variable voltage source, and the variable capacitance diode element of said local oscillator circuit is connected to the variable voltage source through a voltage adjustment circuit connected to a reference voltage source.

2. An AM radio receiver according to claim 1, wherein said voltage adjustment circuit comprises a first resistor, a second resistor, a third resistor, and a fourth resistor; said third and fourth resistors are connected in series between the reference voltage source and the ground; said first and second resistors are connected between the connecting point of the third and fourth resistors and the variable voltage source; and the local oscillator circuit is connected to the connecting point of the first and second resistors.

3. An AM radio receiver according to claim 1, wherein said voltage adjustment circuit comprises a variable resistor connected between the reference voltage source and the ground; said first and second resistors are connected between said variable resistor and said variable voltage source; and the local oscillator circuit is connected to the connecting point of said first and second resistors.

4. An AM radio receiver according to claim 1, wherein said voltage adjustment circuit comprises a first variable resistor connected between the reference voltage source and the ground, and a second variable resistor connected between said first variable resistor and said variable voltage source; and said local oscillator circuit is connected to said second variable resistor.

* * * * *